United States Patent
Chau et al.

(10) Patent No.: US 6,713,358 B1
(45) Date of Patent: Mar. 30, 2004

(54) METHOD FOR MAKING A SEMICONDUCTOR DEVICE HAVING A HIGH-K GATE DIELECTRIC

(75) Inventors: Robert S. Chau, Beaverton, OR (US); Timothy E. Glassman, Portland, OR (US); Christopher G. Parker, Portland, OR (US); Matthew V. Metz, Hillsboro, OR (US); Lawrence J. Foley, Hillsboro, OR (US); Reza Arghavani, Aloha, OR (US); Douglas W. Barlage, Durham, NC (US)

(73) Assignee: Intel Corporation, Santa Clara, CA (US)

( * ) Notice: Subject to any disclaimer, the term of this patent is extended or adjusted under 35 U.S.C. 154(b) by 52 days.

(21) Appl. No.: 10/288,043

(22) Filed: Nov. 5, 2002

(51) Int. Cl.$^7$ .................. H01L 21/336; H01L 21/3205
(52) U.S. Cl. ........................ 438/287; 438/591
(58) Field of Search ................ 438/199, 203, 438/216, 217, 240, 263, 266, 287, 584, 591, 529, 288, 229, 257, 592

(56) References Cited

U.S. PATENT DOCUMENTS

| | | | |
|---|---|---|---|
| 5,625,217 A | 4/1997 | Chau et al. | 257/412 |
| 5,783,478 A | 7/1998 | Chau et al. | 438/592 |
| 5,891,798 A | 4/1999 | Doyle et al. | 438/624 |
| 6,020,024 A * | 2/2000 | Maiti et al. | 427/248.1 |
| 6,060,755 A * | 5/2000 | Ma et al. | 257/410 |
| 6,093,590 A * | 7/2000 | Lou | 438/197 |
| 6,251,761 B1 * | 6/2001 | Rodder et al. | 438/591 |
| 6,268,253 B1 * | 7/2001 | Yu | 438/303 |
| 6,303,481 B2 * | 10/2001 | Park | 438/591 |
| 6,306,741 B1 * | 10/2001 | Lee et al. | 438/585 |
| 6,306,742 B1 | 10/2001 | Doyle et al. | 438/591 |
| 6,365,467 B1 * | 4/2002 | Joo | 438/287 |
| 6,420,742 B1 * | 7/2002 | Ahn et al. | 257/295 |
| 6,461,919 B1 * | 10/2002 | Shibata | 438/275 |
| 6,531,368 B1 * | 3/2003 | Yu | 438/306 |

OTHER PUBLICATIONS

Doug Barlage et al., "High–Frequency Response of 100nm Integrated CMOS Transistors with High–K Gate Dielectrics", 2001 IEEE, 4 pages.
Robert Chau et al., A 50nm Depleted–Substrate CMOS Transistor (DST), 2001 IEEE, 4 pages.

* cited by examiner

Primary Examiner—W. David Coleman
Assistant Examiner—Brook Kebede
(74) Attorney, Agent, or Firm—Mark V. Seeley

(57) ABSTRACT

A method for making a semiconductor device is described. That method comprises forming a high-k gate dielectric layer on a substrate. After forming a silicon nitride layer on the high-k gate dielectric layer, a gate electrode is formed on the silicon nitride layer.

3 Claims, 1 Drawing Sheet

METHOD FOR MAKING A SEMICONDUCTOR DEVICE HAVING A HIGH-K GATE DIELECTRIC

FIELD OF THE INVENTION

The present invention relates to methods for making semiconductor devices, in particular, semiconductor devices that include high-k gate dielectric layers.

BACKGROUND OF THE INVENTION

MOS field-effect transistors with very thin silicon dioxide based gate dielectrics (including those consisting of a silicon dioxide/silicon oxynitride film stack) may experience unacceptable gate leakage currents. Forming the gate dielectric from certain high-k dielectric materials, instead of silicon dioxide, can reduce gate leakage. It may be difficult, however, to integrate such high-k dielectric materials with polysilicon—the preferred material for making the device's gate electrode.

Accordingly, there is a need for an improved process for making a semiconductor device that includes a high-k gate dielectric. There is a need for such a process that enables a polysilicon-based gate electrode to be formed on such a gate dielectric to create a functional device. The method of the present invention provides such a process.

DETAILED DESCRIPTION OF THE PRESENT INVENTION

A method for making a semiconductor device is described. That method comprises forming a high-k gate dielectric layer on a substrate. After forming a silicon nitride layer on the high-k gate dielectric layer, a gate electrode is formed on the silicon nitride layer. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

In an embodiment of the method of the present invention, a high-k gate dielectric layer is formed on a substrate. That substrate may comprise a bulk silicon or silicon-on-insulator substructure. Alternatively, it may comprise other materials—which may or may not be combined with silicon—such as: germanium, indium antimonide, lead telluride, indium arsenide, indium phosphide, gallium arsenide, or gallium antimonide. Although several examples of materials from which the substrate may be formed are described here, any material that may serve as a foundation or base upon which a semiconductor device may be built falls within the spirit and scope of the present invention.

When the substrate comprises a silicon wafer, the wafer should be cleaned before forming the high-k gate dielectric layer on its surface. To clean the wafer, it may initially be exposed to a dilute hydrofluoric acid ("HF") solution, e.g., a 50:1 water to HF solution. The wafer may then be placed in a megasonic tank, and exposed first to a water/hydrogen peroxide ("$H_2O_2$")/ammonium hydroxide ("$NH_4OH$") solution, then to a water/$H_2O_2$/hydrochloric acid ("HCl") solution. The water/$H_2O_2$/$NH_4OH$ solution may remove particles and organic contaminants, and the water/$H_2O_2$/HCl solution may remove metallic contaminants.

Figure 1A:
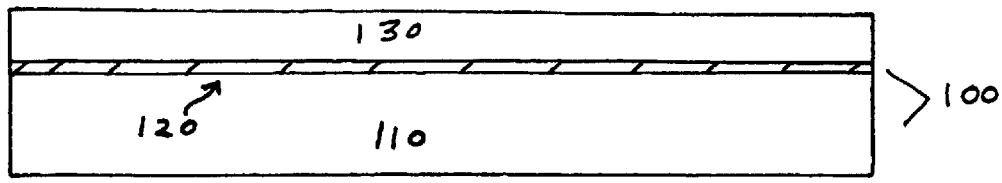
FIGS. 1a–1d represent cross-sections of structures that may be formed when carrying out an embodiment of the method of the present invention.

This cleaning treatment may cause thin chemical oxide 120 to form on silicon wafer 110. That oxide may be less than about 5 angstroms thick. High-k gate dielectric layer 130 may then be formed on substrate 100, which comprises silicon wafer 110 and oxide 120, to generate the structure illustrated by FIG. 1a. High-k gate dielectric layer 130 comprises a material with a dielectric constant that is greater than the dielectric constant of silicon dioxide. Dielectric layer 130 preferably has a dielectric constant that is at least about twice that of silicon dioxide, i.e., a dielectric constant that is greater than about 8. Materials that may be used to make high-k gate dielectrics include: hafnium oxide, lanthanum oxide, zirconium oxide, zirconium silicon oxide, zirconium silicate, titanium oxide, tantalum oxide, barium strontium tanium oxide, barium titanium oxide, strontium titanium oxide, yttrium oxide, aluminum oxide, lead scandium tantalum oxide, and lead zinc niobate. Particularly preferred are hafnium oxide, zirconium oxide, titanium oxide, and aluminum oxide. Although a few examples of materials that may be used to form dielectric layer 130 are described here, that layer may be made from other materials that serve to reduce gate leakage.

High-k gate dielectric layer 130 may be formed on substrate 100 using a conventional deposition method, e.g., a conventional chemical vapor deposition ("CVD"), low pressure CVD, or physical vapor deposition ("PVD") process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and dielectric layer 130. The CVD reactor should be operated long enough to form a layer with the desired thickness. In most applications, dielectric layer 130 should be less than about 100 angstroms thick, and more preferably between about 5 angstroms and about 40 angstroms thick.

Figure 1B:
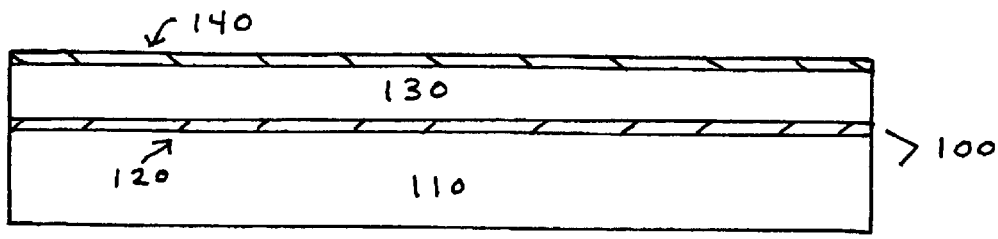

In the method of the present invention, silicon nitride layer 140 is formed on high-k gate dielectric layer 130, as illustrated in FIG. 1b. In a preferred embodiment, a direct or remote plasma enhanced chemical vapor deposition ("PECVD") process is used to form the silicon nitride layer. In such a PECVD process, the reactor should be operated under the appropriate conditions (e.g., temperature, pressure, radio frequency, and power) for a sufficient time to generate a silicon nitride layer that is less than about 40 angstroms thick, and more preferably between about 1 angstrom and about 25 angstroms thick.

Figure 1C:
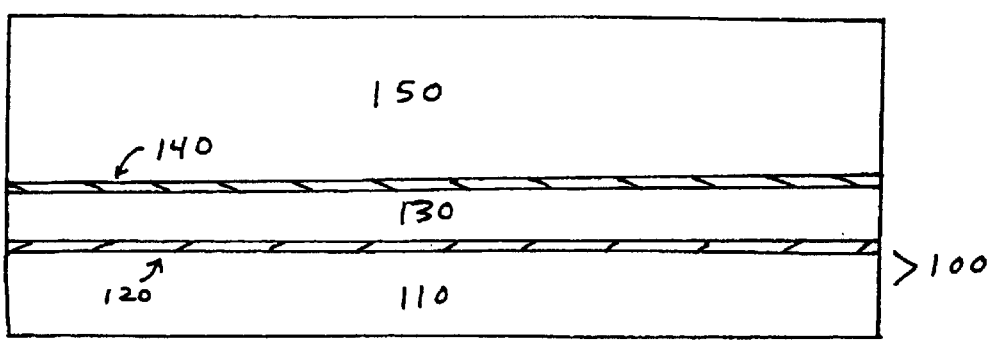
Figure 1D:
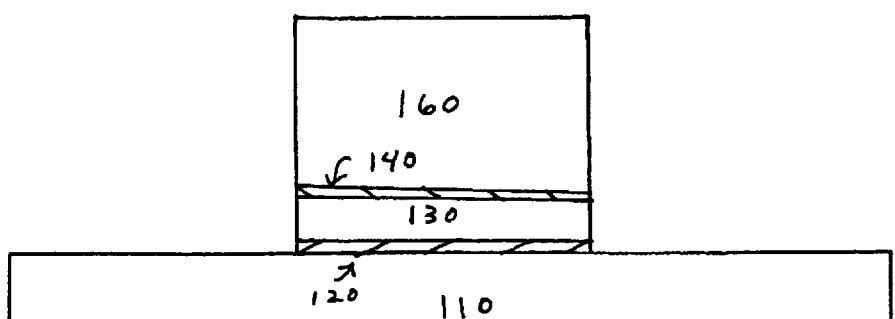

After forming silicon nitride layer 140 on high-k gate dielectric layer 130, a gate electrode may be formed on silicon nitride layer 140. In a preferred embodiment, the gate electrode may be formed by initially depositing polysilicon layer 150 on silicon nitride layer 140—generating the FIG. 1c structure. Polysilicon layer 150 may be deposited using conventional methods and preferably is between about 500 angstroms and about 4,000 angstroms thick. After etching layers 150, 140, 130 and 120 to form the FIG. 1d structure, using conventional techniques, additional steps that are generally used to complete the gate electrode (e.g., forming a silicide (not shown) on the upper part of etched polysilicon structure 160) may be applied. As such steps are well known to those skilled in the art, they will not be described in more detail here. Although the gate electrode preferably comprises polysilicon, it may alternatively be formed from various metals with which the above described high-k gate dielectrics may be used.

The process described above may produce a device with an ultra thin gate dielectric that has acceptable gate leakage characteristics. In addition, this process may enable a high-k gate dielectric to be used with a polysilicon-based gate electrode. Features shown in the above referenced drawings are not intended to be drawn to scale.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:

providing a substrate;

forming a high-k gate dielectric layer on the substrate;

forming a silicon nitride layer on the high-k date dielectric layer; and forming a gate electrode on the silicon nitride layer;

wherein the high-k gate dielectric layer is less than about 100 angstroms thick, is formed using an atomic layer chemical vapor deposition process, and comprises a material selected from the group consisting of hafnium oxide, lanthanum oxide, zirconium oxide, zirconium silicon oxide, zirconium silicate, titanium oxide, tantalum oxide, barium strontium titanium oxide, barium titanium oxide, strontium titanium oxide, yttrium oxide, aluminum oxide, lead scandium tantalum oxide, and lead zinc niobate;

wherein the silicon nitride layer is less than about 40 angstroms thick and is formed using a plasma enhanced chemical vapor deposition process;

wherein the gate electrode comprises polysilion;

wherein the substrate comprises a silicon wafer upon which is formed a chemical oxide layer that is less than about 5 angstroms thick; and wherein the chemical oxide layer is formed by exposing the silicon wafer to a first solution that comprises hydrofluoric acid, then to a second solution that comprises hydrogen peroxide and ammonium hydroxide, and then to a third solution that comprises hydrogen peroxide and hydrochloric acid.

2. A method for making a semiconductor device comprising:

providing a substrate;

forming a high-k gate dielectric layer on the substrate that comprises a material selected from the group consisting of hafnium oxide, zirconium oxide, titanium oxide, and aluminum oxide;

forming a silicon nitride layer on the high-k gate dielectric layer, and forming a layer that comprises polysilicon on the silicon nitride layer;

wherein the high-k gate dielectric layer is formed by atomic layer chemical vapor deposition, and is between about 5 angstroms and about 40 angstroms thick;

wherein the silicon nitride layer is formed using a plasma enhanced chemical vapor deposition process and is between about 1 angstrom and about 25 angstroms thick;

wherein the layer that comprises polysilicon is between about 500 angstroms and about 4,000 angstroms thick;

wherein the substrate comprises a silicon wafer upon which is formed a chemical oxide layer that is less than about 5 angstroms thick; and wherein the chemical oxide layer is formed by exposing the silicon wafer to a first solution that comprises hydrofluoric acid, then to a second solution that comprises hydrogen peroxide and ammonium hydroxide, and then to a third solution that comprises hydrogen peroxide and hydrochloric acid.

3. A method for making a semiconductor device comprising:

providing a silicon wafer;

forming a chemical oxide layer on the silicon wafer that is less than about 5 angstroms thick;

forming high-k gate dielectric layer on the chemical oxide layer that comprises hafnium oxide and that is between about 5 angstroms and about 40 angstroms thick;

forming a silicon nitride layer on the high-k gate dielectric layer;

forming a layer that comprises polysilicon on the silicon nitride layer; and etching the polysilicon containing layer, the silicon nitride layer, the high-k gate dielectric layer, and the chemical oxide layer;

wherein the high-k gate dielectric layer is formed by atomic layer chemical vapor deposition, and the silicon nitride layer is formed using a plasma enhanced chemical vapor deposition process and is between about 1 angstrom and about 25 angstroms thick;

wherein the layer that comprises polysilicon is between about 500 angstroms and about 4,000 angstroms thick, and wherein the chemical oxide layer is formed by exposing the silicon wafer to a first solution that comprises hydrofluoric acid, then to a second solution that comprises hydrogen peroxide and ammonium hydroxide, and then to a third solution that comprises hydrogen peroxide and hydrochloric acid.

* * * * *